United States Patent [19]

Aikins

[11] Patent Number: 4,951,834
[45] Date of Patent: Aug. 28, 1990

[54] MOLDED GASKET FOR INSTRUMENT HOUSING

[75] Inventor: Brian S. Aikins, Everett, Wash.

[73] Assignee: John Fluke Mfg. Co., Inc., Everett, Wash.

[21] Appl. No.: 405,894

[22] Filed: Sep. 12, 1989

[51] Int. Cl.⁵ .......................................... B65D 7/00
[52] U.S. Cl. .................................. 220/80; 220/81 R
[58] Field of Search .............................. 220/80, 81 R

[56] References Cited

U.S. PATENT DOCUMENTS

| | | | |
|---|---|---|---|
| 3,225,952 | 12/1965 | Stiles | 220/80 |
| 3,283,348 | 11/1966 | Farmer et al. | 220/80 |
| 3,428,347 | 2/1969 | Tramontini | 220/80 |
| 3,519,162 | 7/1970 | Peterson et al. | 220/80 |
| 4,322,572 | 3/1982 | Snyder | 220/80 |
| 4,440,307 | 4/1984 | Bartels et al. | 220/80 |

Primary Examiner—Joseph Man-Fu Moy
Attorney, Agent, or Firm—Stephen A. Becker

[57] ABSTRACT

An instrument housing comprises an upper housing portion and a lower housing portion together enclosing instrumentation circuitry. An outer surface of one of the lower housing portion is formed, circumferentially, with a series of gasket locking elements. A gasket injection molded on the series of dovetail-shaped gasket locking elements forms a seal between the upper and lower housing portions. Mechanical locking between the gasket and dovetail-shaped elements retains the gaskeet in place between the housing portions so that the gasket tends not to dislodge from the instrument even if it is dropped.

20 Claims, 3 Drawing Sheets

MOLDED GASKET FOR INSTRUMENT HOUSING

TECHNICAL FIELD

The present invention is related generally to seals, and more particularly, to a gasket for sealing top and bottom portions of an instrument housing.

BACKGROUND ART

The housing of a measurement instrument typically is comprised of top and bottom halves that are assembled together to form an enclosure for electronic circuitry. To seal the instrument from dust and water, and to provide a non-slip surface to the housing so that the instrument can be propped up, a gasket, ordinarily made of an elastomeric material, is located between the halves.

For example, with reference to FIG. 1, in instrument housing of the prior art has top and bottom portions 20 and 22 enclosing a circuit board 24 containing electronic components and circuit wiring. Between the housing portions 20, 22 there is a gasket 26 that is provided as a separate piece in the form of an elastomeric strip, banded around the outer surface of the lower portion 20 of the instrument housing. The corners of the housing may be rounded as shown. When the top and bottom portions 20, 22 of the housing are assembled, the gasket 26 becomes sandwiched between them to form the seal.

While generally satisfactory, this type of seal has certain deficiencies. For example, the instrument housing must be able to withstand impacts, such as would be caused by dropping, without dislodging the seal. However, portions of the prior art gasket outside the rounded corners of the housing tends to dislodge from the region between the top and bottom portions when the instrument housing is dropped. This also occasionally occurs when the instrument is inserted in or removed from a holster.

Once dislodged from the housing, the gasket is not easy for the user to reinstall. Furthermore, original assembly of the housing is difficult because the gasket, to be reasonably secure so that it does not dislodge, must be adhered to one of the housing halves using an adhesive, and this requires an additional manufacturing step.

DISCLOSURE OF THE INVENTION

Accordingly, one object of the invention is to improve a seal between mechanical parts.

Another object is to provide an improved seal for the top and bottom portions of an instrument housing.

Another object of the invention is to simplify manufacture of a sealed instrument housing.

Another object of the invention is to seal an instrument housing with a gasket that tends not to become dislodged when the housing is subjected to mechanical impact.

Still another object of the invention is to seal an instrument housing with a gasket that is easily reinstalled if dislodged from the housing.

Another object is to secure the gasket of an instrument housing without using an adhesive.

The above and other objects and features of the invention are satisfied, in accordance with the invention, by an instrument housing assembly having a top housing portion and a bottom housing portion, together enclosing instrumentation circuitry, wherein an outer surface of either the top or bottom housing portion is formed, circumferentially, with a series of preferably dovetail-shaped gasket locking elements. A gasket formed of a thermoplastic elastomeric material injection molded on the series of gasket locking elements forms a seal between the top and bottom housing portions of the housing assembly.

In the preferred embodiment, a peripheral surface of the bottom housing portion comprises, at least at its corners, a circumferential lip, and a surface of the gasket facing the lip is recessed to receive the lip. The inner surface of the gasket is formed with tines, preferably dovetail-shaped, complimentary to the gasket locking elements, which extend to the bottom housing portion to interfit with the elements.

In accordance with one aspect of the invention, a portion of each tine of the gasket protrudes and is spaced apart from the inner surface of the gasket, and the bottom housing portion contains corresponding recesses to receive the protruding portions of the tines.

Preferably, the outer surface of the gasket is arcuate and extends outwardly slightly from the outer surfaces of the top and bottom housing portions, to form a non-slip region of the housing to enable the housing to be mounted upright on a support surface. Corners of the housing assembly are rounded, and the gasket locking elements are omitted at the rounded corners.

In accordance with another aspect of the invention, all the way around, the surface of the gasket facing the top housing portion is recessed, and the top housing portion is formed with a lip for seating in the recess.

Thus, mechanical locking between the gasket and the dovetail-shaped gasket locking elements formed on the surface of the housing prevents the gasket from dislodging, even upon drop impact of the instrument. The lock also enables the gasket to be assembled to the housing without use of an adhesive. In addition, manufacture of the seal is simplified as a result of injection molding the gasket on the housing portion as a separate step, so that the housing functions as a mold for forming the gasket.

Furthermore, the gasket is held entirely on the outside surface of the housing; no holes are required in the housing. Any such holes would violate electrical safety requirements, even if the holes were sealed.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

BEST MODE FOR PRACTICING THE INVENTION

Figure 1:
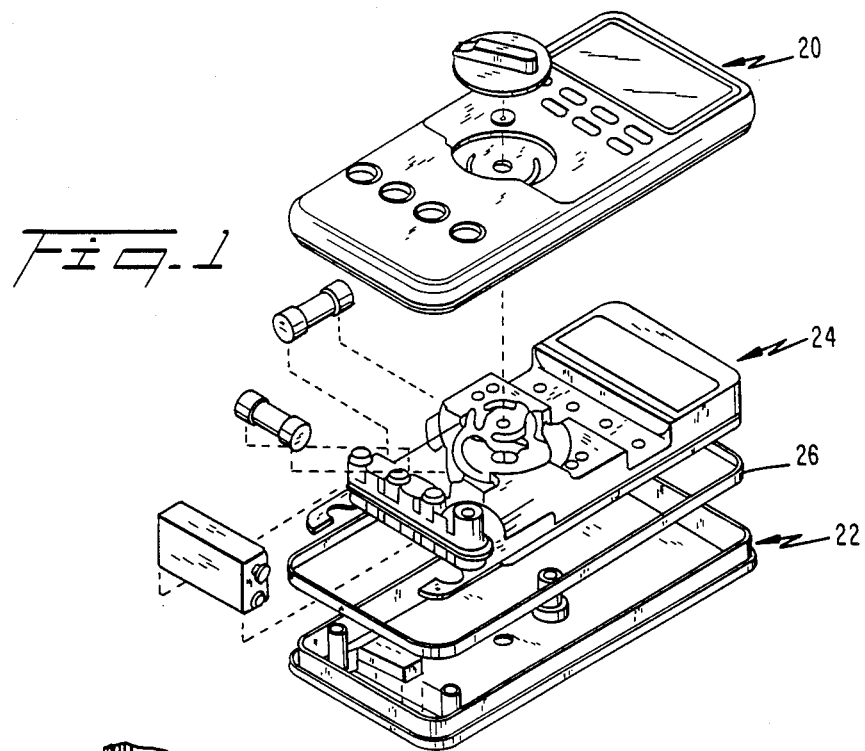
FIG. 1 is an exploded view of a sealed instrument housing of the prior art.

In FIG. 1, an instrument housing of the prior art comprising a top portion or half 20 and bottom portion or half 22, positioned on opposite sides of gasket 26, forms a sealed housing assembly. The gasket is simply banded between the top and bottom portions of the housing, adhered to one half. However, in accordance with the present invention, a gasket is injection molded on the bottom half of the housing, with the gasket mechanically locked to gasket locking members formed integrally to the housing. The gasket locking members preferably are in the form of dovetail-shaped elements that interfit with complimentary tines formed on the gasket during the injection molding process.

Figure 2:
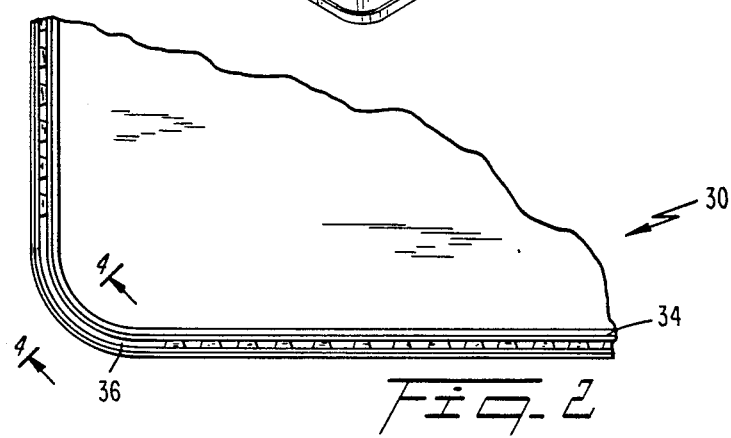
FIG. 2 is a top view of a portion of the bottom half of an instrument housing, with dovetail-shaped gasket locking members provided on the linear sides of the housing.
Figure 3:
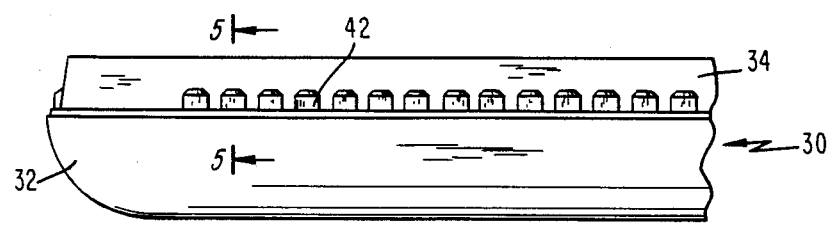
FIG. 3 is a side view of the portion of the housing shown in FIG. 2.

Thus, with reference to FIGS. 2 and 3, the bottom half 30 of an improved instrument housing has a base 32 with a skirt 34 extending upwardly and offset slightly inwardly (see FIG. 2) to form a recess 36 therebetween. Formed circumferentially along the outer surface of the skirt 34 is a series of reverse bevelled elements 42 that are designed to mechanically retain a gasket 38 (FIGS. 6-9), made preferably of a thermoplastic elastomer.

Gasket 38 is in the form of a closed band that extends circumferentially around skirt 34, and is seated in recess 36. A plurality of tines 40 (FIG. 7) extend from the gasket 38 into the spaces between adjacent dovetail shaped elements 42. The gasket 38 becomes locked mechanically to the skirt 34 of lower housing 30 because tines 40 wedge between elements 42, so that the gasket does not shift longitudinally or radially on, or become dislodged from, the skirt.

Figure 10:
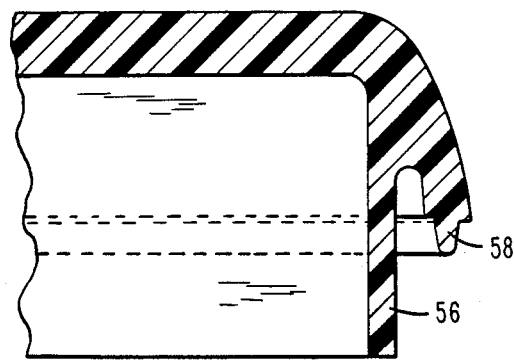
FIG. 10 is a cross-sectional view of a portion of the top housing showing a circumferential lip.

The upper surface of the gasket 38 has a circumferential recess 44 (FIG. 11), to receive and seat a corresponding lip 58, shown in FIG. 10, that is formed in the upper half 20 of the housing. The manner by which the upper and lower halves of the instrument housing interfit with each other on opposite sides of gasket 38 will become more clear with reference to FIGS. 4, 5, 10 and 11.

Figure 4:
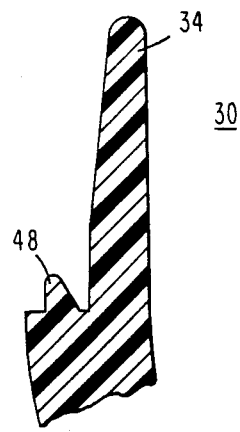
FIG. 4 is a cross-sectional view of the housing taken along line 4—4 in FIG. 2 showing a circumferential lip extending from the housing for receiving the gasket.
Figure 5:
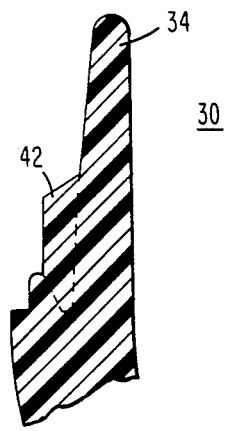
FIG. 5 is a cross-sectional view of the housing taken along the line 5—5 in FIG. 3.
Figure 6:
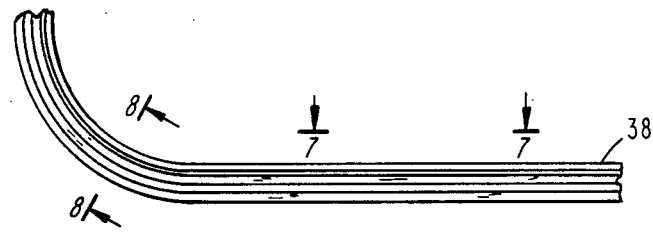
FIG. 6 is a top view of the gasket.
Figure 7:
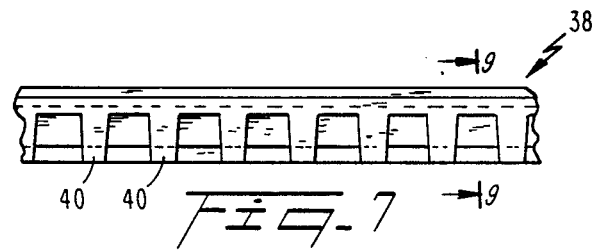
FIG. 7 is a view of the inner surface of the gasket, with complementary dovetail-shaped tines formed thereon.

In FIGS. 4 and 5, formed on the bottom half 30 of the instrument housing is the skirt 34, which carries, on its outer surface, the series of gasket locking elements 42. The elements 42 are equally spaced from each and lie along only the linear sides of the skirt; i.e., the elements preferably are not formed on the rounded corners of the housing, as shown in FIG. 2. Adjacent the skirt 34 in FIG. 4 is a small abutment 48 helpful in the corners for receiving and stabilizing the lower end of the gasket 38.

Figure 8:
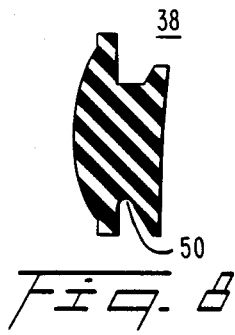
FIG. 8 is a cross-sectional view of the gasket taken along the line 8—8 in FIG. 6.
Figure 9:
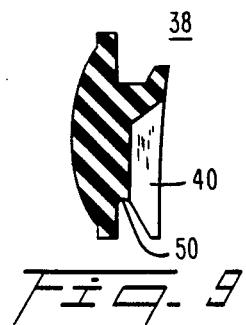
FIG. 9 is a cross-sectional view of the gasket taken along the line 9—9 in FIG. 7.

The gasket 38 is button-shaped in cross section, as shown in FIGS. 8 and 9, with tines 40 distributed along the length of the gasket at regions thereof that are linear. In other words, the corners of the gasket 38, which are rounded to correspond to the corners of the instrument housing, preferably are not provided with the locking tines 40. A recessed portion 50, formed in the lower end of the gasket 38, has a shape that is complimentary to that of abutment 48 of the bottom half 30 of the housing, so that the gasket can be seated on the abutment, as shown in FIG. 11.

The upper half 20 of the housing has a lip 54 formed with an abutment 58 that together extend downward over, and are spaced slightly apart from, a circumferential skirt 56. The abutment 58 is seated in the gasket 38 (FIG. 11), to form the seal when the housing is assembled.

Figure 11:
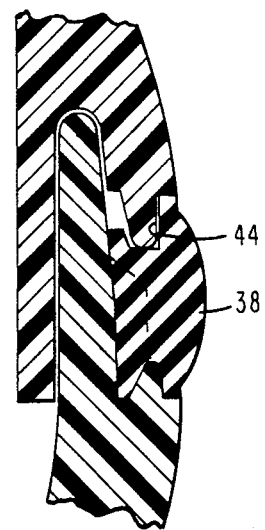
FIG. 11 is a cross-sectional view of the portion of the housing of FIG. 10, assembled to the bottom housing portion and gasket to form the housing assembly.
Figure 12:
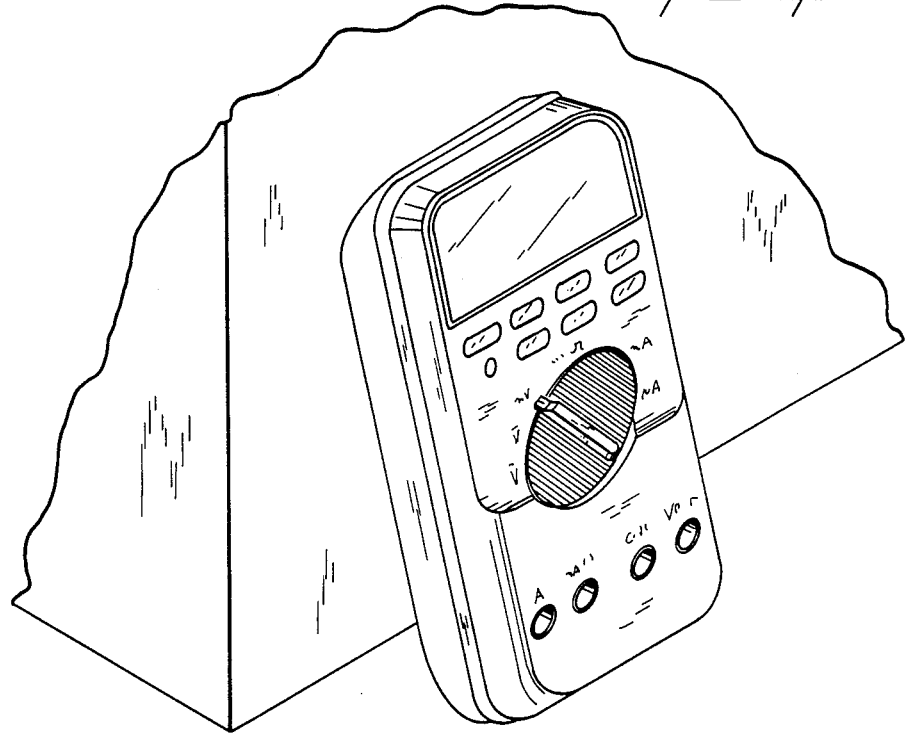
FIG. 12 is a perspective view of the instrument housing propped, with the gasket forming a non-slip surface for the housing.

When the instrument housing is assembled as shown in FIG. 11, the tines 40 formed in gasket 38 are forced downward and into the recess 36 in the lower half 30 of the housing, between adjacent locking elements 42. Accordingly, it is not possible for the gasket 38 to shift along the length of the housing skirt, even if an impact force is imparted to the housing, as would occur if the instrument is dropped. A tight seal is formed with the skirt 34 of the bottom half 30 of the housing interfitted with skirt 56 and overhang 54 of the top half 20 of the housing, as shown, and with the gasket 38 lodged between them. The outer surface of the gasket 38, being arcuate as shown in FIG. 11, provides a non-slip surface for the periphery of the instrument, so that the instrument can be propped up as shown in FIG. 12, or easily gripped by hand.

The gasket 38 is formed of a thermoplastic material that is injection molded directly on the skirt 34 of the bottom half 30 of the housing during manufacture. The gasket can be manually removed from the skirt, because it does not adhere to it, and can easily be repositioned into the bottom half of the housing by manually positioning the tines 40 of gasket 38 into the spaces between gasket locking elements 42. The tines 42 and locking elements 40 are easily aligned manually.

No gasket tines 40 and gasket locking elements 42 preferably are formed on the rounded corners of the instrument housing, because none are necessary. We have found, in this regard, that only the linear portions of the gasket of the prior art tend to dislodge from the instrument; the gasket usually remains intact at the corners even if the instrument is dropped.

There accordingly has been described an instrument housing seal that is formed of an elastomeric elastomer material injection molded directly on the skirt of a lower housing member, wherein the lower housing is formed with dovetail shaped gasket locking elements that receive and secure the gasket in position between the housing halves. Because the gasket locking elements are dovetail shaped, the gasket will tend not to become dislodged from the housing, even if dropped. In the event that the gasket becomes dislodged during use, or intentionally removed during servicing or repair, the gasket can be conveniently relocated on the lower housing, with the gasket tines 40 seated in alignment between gasket locking elements 42.

In this disclosure, there is shown and described only the preferred embodiment of the invention, but, as aforementioned, it is to be understood that the invention is capable of use in various other combinations and environments and is capable of changes or modifications within the scope of the inventive concept as expressed herein. For example, although the preferred embodiment is implemented in the context of an instrument housing, the same principles can be applied to seals in other environments. Also, whereas the locking members are formed in the bottom half of the housing, the members may alternatively be provided on the top half. As another example, although the dovetail shape of the gasket locking elements 42 are preferred, other locking configurations are possible as well.

What is claimed is:

1. An instrument housing, comprising:
   an upper housing portion and a lower housing portion together enclosing instrumentation circuitry;
   a gasket forming a seal between said upper and lower housing portions; and
   a gasket receiving surface of one of said upper and lower housing portions being formed circumferentially with a plurality of spaced apart gasket locking elements;
   said gasket comprising a strip of material formed circumferentially on one of said upper and lower housing portions and housing a plurality of longitudinally spaced apart housing locking elements complementary to and interlocking with said plurality of spaced apart gasket locking elements.

2. The instrument housing of claim 1, wherein said gasket is molded on said plurality of gasket locking elements.

3. The instrument housing of claim 1, wherein an outer surface of said gasket is arcuate and extends outwardly from outer surfaces of said upper and lower housing portions to form a non-slip region of said housing.

4. An instrument housing, comprising:
   an upper housing portion and a lower housing portion together enclosing instrumentation circuitry;
   a gasket forming a seal between said upper and lower housing portions; and
   a gasket receiving surface of one of said upper and lower housing portions being formed circumferentially with a plurality of gasket locking elements;
   said gasket being formed circumferentially with a plurality of housing locking elements complementary to said gasket locking elements;
   wherein said gasket locking elements comprise dovetail-shaped members on said upper or lower housing portion, and said housing locking elements comprise tines formed on said gasket and complementary to said members to mechanically lock to said housing.

5. The instrument housing of claim 4, wherein a periphery of one of said upper and lower housing portions comprises a circumferential lip, and wherein a surface of said gasket facing said lip is formed with a circumferential recess for receiving said lip.

6. The instrument housing of claim 5, wherein the inner surface of said gasket is formed with said tines, and said tines extend toward the other one of said upper and lower housing portions.

7. The instrument housing of claim 6, wherein extending portions of said tines are spaced apart from the inner surface of said gasket, and said other one of said upper and lower housing portions contains corresponding recesses to receive said extending portions of said tines.

8. The instrument housing of claim 7, wherein an outer surface of said gasket is arcuate and extends outwardly from corresponding outer surfaces of said upper and lower housing portions to form a non-slip region of said housing.

9. The instrument housing of claim 8, wherein corners of said upper and lower housing portions are rounded, and wherein said tines and corresponding recesses are omitted at said rounded corners of said housing.

10. The instrument housing of claim 9, wherein surfaces of said gasket facing said other one of said upper and lower housing portions are formed, only at said rounded corners thereof, with a recess, and corresponding rounded corners of said other one of said upper and lower housing portions are formed with lips for interfitting with said gasket.

11. The instrument housing of claim 10, wherein said gasket is formed of a thermoplastic elastomer.

12. An instrument housing, comprising:
    an upper housing portion and a lower housing portion together enclosing instrumentation circuitry;
    a gasket forming a seal between said upper and lower housing portions; and
    a gasket receiving surface of one of said upper and lower housing portions being formed circumferentially with a plurality of gasket locking elements;
    said gasket being formed circumferentially with a plurality of housing locking elements complementary to said gasket locking elements;
    wherein corners of said upper and lower housing portions are rounded, and wherein said housing and gasket locking elements are omitted at said rounded corners.

13. An instrument housing, comprising:
    an upper housing portion and a lower housing portion together enclosing instrumentation circuitry, an outer surface of one of said upper and lower housing portions being formed, circumferentially, with a series of dovetail-shaped gasket locking elements; and
    a gasket injection molded on said series of gasket locking elements and forming a seal between said upper and lower housing portions.

14. The instrument housing of claim 13, wherein a periphery of one of said upper and lower housing portions comprises a circumferential lip, and wherein a surface of said gasket facing said lip is formed with a circumferential recess for receiving said lip.

15. The instrument housing of claim 14, wherein the inner surface of said gasket is formed with tines to complementary said gasket locking elements for mechanical locking therewith.

16. The instrument housing of claim 15, wherein extending portions of said tines are spaced apart from the inner surface of said gasket, and said other one of said upper and lower housing portions contains corresponding recesses to receive said extending portions of said tines.

17. The instrument housing of claim 16, wherein an outer surface of said gasket is arcuate and extends from outer surfaces of said upper and lower housing portions to form a non-slip region of said housing.

18. The instrument housing of claim 17, wherein corners of said upper and lower housing portions are rounded, and wherein said gasket locking elements and tines are omitted at regions of said rounded corners.

19. The instrument housing of claim 18, wherein surfaces of said gasket facing said other one of said upper and lower housing portions are formed, only at said rounded corners thereof, with a recess, and corresponding rounded corners of said other one of said upper and lower housing portions are formed with lips for seating in said recess of said gasket.

20. The instrument housing of claim 19, wherein said gasket is formed of a thermoplastic elastomer.

* * * * *